(12) United States Patent
Gasanov et al.

(10) Patent No.: US 6,513,148 B1
(45) Date of Patent: Jan. 28, 2003

(54) DENSITY DRIVEN ASSIGNMENT OF COORDINATES

(75) Inventors: Elyar E. Gasanov, Moscow (RU);
Andre J. Zolotykh, Fryazino (RU);
Youri P. Postelga, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 92 days.

(21) Appl. No.: 09/844,361

(22) Filed: Apr. 27, 2001

(51) Int. Cl.⁷ .............................................. G06F 17/50
(52) U.S. Cl. .................. 716/10; 716/1; 716/2; 716/4; 716/5; 716/6; 716/8; 716/11; 716/18
(58) Field of Search ........................... 716/10, 8, 9, 11, 716/2, 5, 17; 438/14, 17, 128

(56) References Cited

U.S. PATENT DOCUMENTS

| | | | |
|---|---|---|---|
| 4,607,339 A | * 8/1986 | Davis | 716/10 |
| 5,774,371 A | * 6/1998 | Kawakami | 716/10 |
| 5,859,782 A | 1/1999 | Scepanovic et al. | |
| 6,026,223 A | 2/2000 | Scepanovic et al. | |
| 6,031,981 A | * 2/2000 | Lee et al. | 716/10 |
| 6,202,194 B1 | * 3/2001 | Seningen et al. | 716/10 |
| 6,282,693 B1 | * 8/2001 | Naylor et al. | 716/10 |
| 6,301,693 B1 | * 10/2001 | Naylor et al. | 716/10 |
| 6,336,209 B1 | * 1/2002 | Nishihara et al. | 716/10 |
| 6,370,673 B1 | * 4/2002 | Hill | 716/10 |

* cited by examiner

Primary Examiner—Michael Tokar
Assistant Examiner—Lam T Mai
(74) Attorney, Agent, or Firm—Luedeka, Neely & Graham (57) ABSTRACT

An optimizing method for integrated circuits wherein coordinates are assigned to cells of a logic tree in a manner that maintains desirable cell density characteristics.

6 Claims, 6 Drawing Sheets

DENSITY DRIVEN ASSIGNMENT OF COORDINATES

FIELD

This invention relates to the field of integrated circuits. More particularly this invention relates to methods for assigning coordinates to cells of logic trees of integrated circuits in a manner which maintains desirable cell density characteristics.

BACKGROUND

Microelectronic integrated circuits consist of a large number of electronic components, including individual logic devices or groups of logic devices that are applied to the surface of a substrate, typically a silicon wafer. The components are typically grouped to provide an application-specific integrated circuit. For each application-specific integrated circuit, placement of the components in optimum positions provides efficient layout of the components on the substrate in order to reduce manufacturing costs, processor delays, size and the like. Because the application-specific integrated circuits typically contain hundreds of thousands, if not millions of components, the task of optimizing the placement of components on a substrate surface is not practical without the aid of computers.

Computer aided designs are effective to provide component location on the substrate surface for minimizing interconnection distances, wire sizes, processing times and the like. The smallest component placed on a substrate surface is defined as a "cell." A cell may be a single logic component of a larger logic tree or may be one or more logic trees. Assuming the number of cells N to be in the hundreds of thousands or millions, the number of different ways that the cells can be arranged on the substrate surface is equal to about N factorial. Selecting the optimum placement of the cells is therefore an extremely time consuming task.

Furthermore, despite the use of computer aided design techniques, algorithms used for selecting cell locations on the substrate surface may lead to cell congestion or overpopulation of cells in an area of the substrate surface. Overpopulation or overcrowding of an area of the substrate surface is undesirable from the standpoint of enabling efficient wiring routes, reducing overlapping circuits and the like. Accordingly, there continues to be a need for methods useful to further improve the cell placement on a substrate surface in order to lower substrate costs and increase processor speeds.

SUMMARY

The present invention relates to a method for selectively assigning coordinates to cells of a logic tree incorporated into an application-specific integrated circuit formed on a substrate surface. In a preferred embodiment, the method includes the steps of:

(a) determining coordinates of an old logic tree and performing an optimization of the old logic tree to obtain a new logic tree;

(b) determining coordinates for cells of the new logic tree which are connected to an output pin of the new logic tree (c) determining coordinates for tree entrances to the new logic tree;

(d) determining coordinates for all cells of the old logic tree from the coordinates of the old logic tree determined in step (a), (e) determining approximate coordinates for the cells of the new logic tree from the coordinates of the cells of a new logic tree connected to the output pin of the new logic tree determined in step (b) and the coordinates of the tree entrances to the new logic tree determined in step (c);

(f) sorting the approximate coordinates determined in step (e) based on the importance of each cell;

(g) determining optimized coordinates for each cell of the new logic tree based on the approximate coordinates of the new logic tree determined in step (e), the sorted approximate coordinates determined in step (f), and the coordinates of the cells of the old logic tree determined in step (d).

BRIEF DESCRIPTION OF THE DRAWINGS

Further advantages of the invention are apparent by reference to the detailed description. when considered in conjunction with the figures, which are not to scale so as to more clearly show the details, wherein like reference numbers indicate like elements throughout the several views, and wherein.

DETAILED DESCRIPTION

Figure 1:
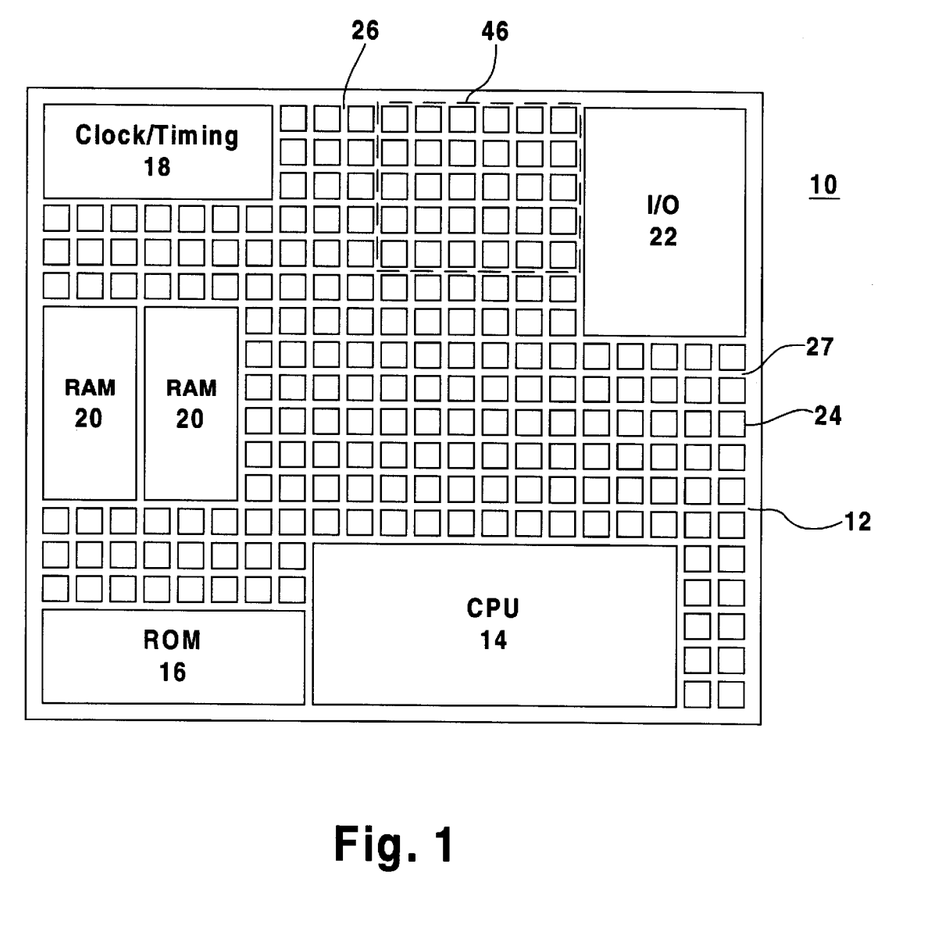
FIG. 1 is a representational diagram of an integrated circuit.

Referring now to FIG. 1 there is shown an integrated circuit substrate 10 provided by a semiconductor substrate 12, such as a silicon substrate, having a plurality of components thereon. The components of the substrate are preferably made by layering various materials on the substrate 12 in deposit and etch cycles. The arrangement of the components on the substrate 12 is described in terms of a geometric description referred to as a layout, characterized by a plurality of planar geometric shapes separated from one another and arranged in layers on the substrate 12. Masks or patterns corresponding to the layout are used to render desired shapes at desired locations on the wafer in a series of photolithograpic steps.

For example, the substrate 10 includes a plurality of functional circuit blocks formed thereon. These circuit blocks may include a central processing unit (CPU) 14, read-only memory (ROM) 16, clock/timing unit 18, random access memory (RAM) 20, and input/output interface (I/O) 22. The circuit substrate 10 preferably includes numerous (e.g., from about 10,000 to several million) cells 24. The cells 24 and the other components of the substrate 10 more specifically described above are interconnected or routed according to a desired logical design of the substrate corresponding to a desired application. The routing or interconnection between the cells is accomplished by electrically conductive lines or traces formed during the photolithographic steps and located in vertical channels 26 and horizontal channels 27 between the cells 24.

Each cell 24 corresponds to a logic element, such as a gate, or to a combination of logic elements interconnected to perform a specific function. For example, and with reference to FIG. 2, there is shown a logic tree 28 defined by a plurality of logic cells 30. Each logic cell 30 is preferably one of the cells 24 having an output pin provided by a standard logic gate. With reference to FIGS. 3a–3f, there are shown, respectively, examples of standard logic gates such as AND gate 30a, NAND gate 30b, NOT gate 30c, OR gate 30d, NOR gate 30e, and XOR gate 30f.

Figure 2:
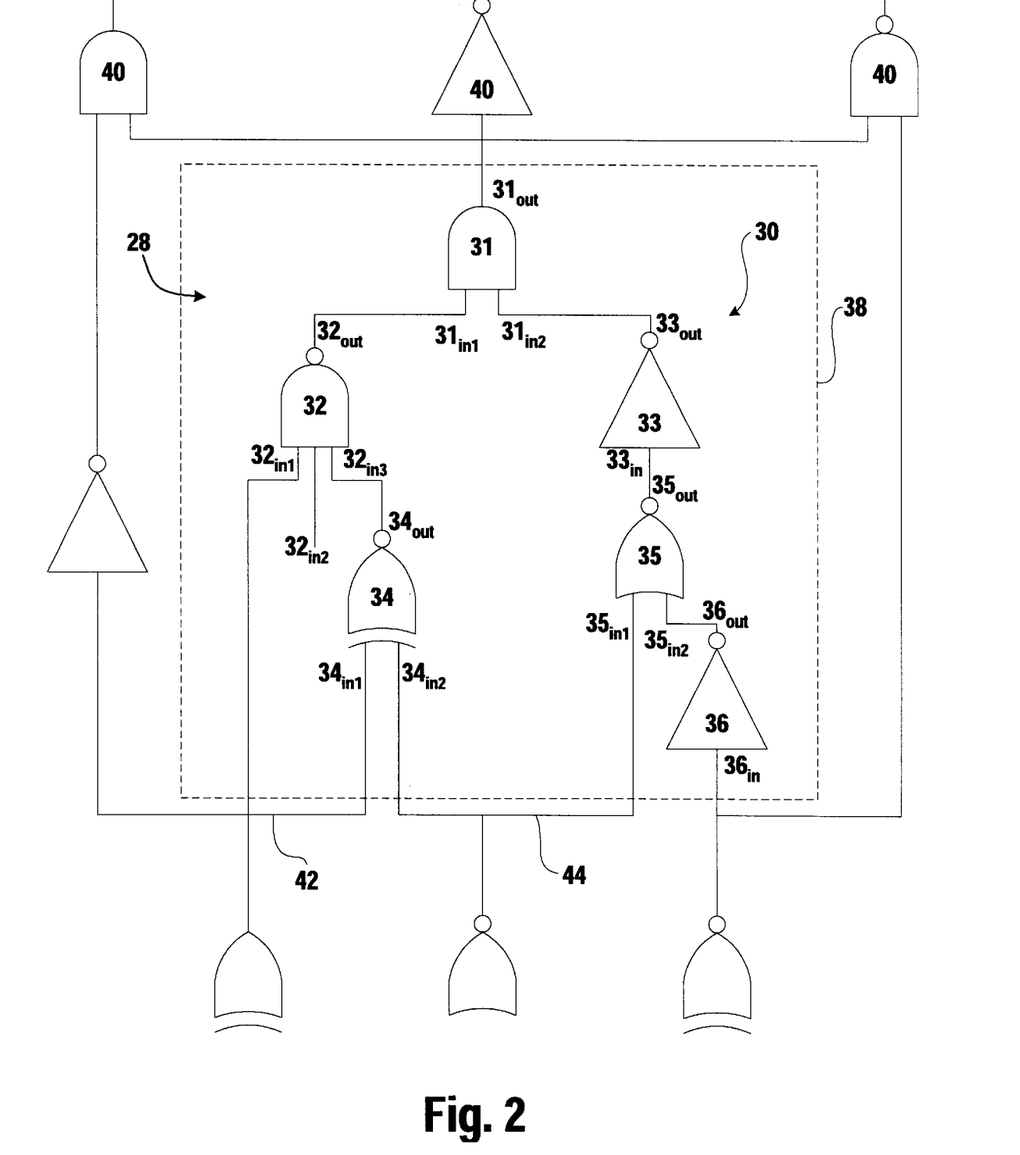
FIG. 2 is a representational diagram of a logic tree.
Figure 3A:
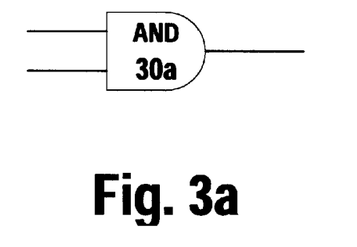
FIGS. 3a–3f are examples of standard logic gates.
Figure 3B:
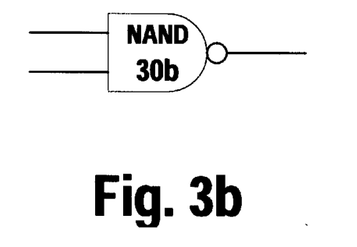
Figure 3C:
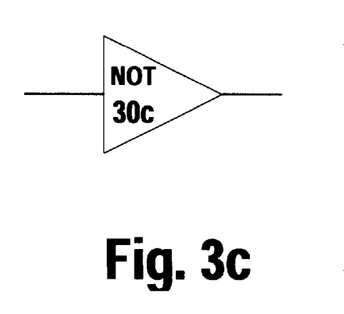
Figure 3D:
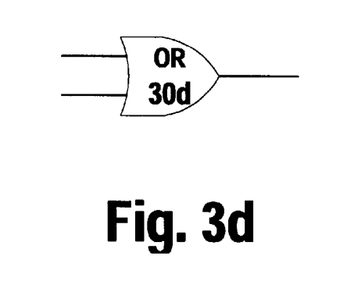
Figure 3E:
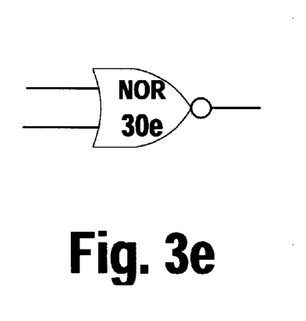
Figure 3F:
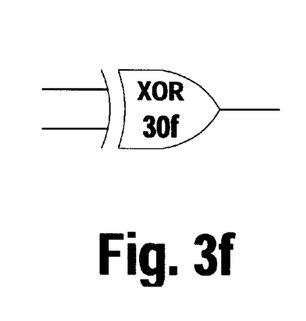

As an example, and with additional reference to FIG. 2, logic tree 28 includes six cells 31–36 located within an imaginary rectangle 38 indicated in dashed lines. Each of the cells 31–36 preferably has a single output pin, designated $31_{out}$–$36_{out}$, respectively. Each of the cells 31–36 also has one or more input pins. For example, cell 31 has input pins $31_{in1}$ and $31_{in2}$. Cell 32 has input pins $32_{in1}$, $32_{in2}$, and $32_{in3}$. In the same manner, cells 33–36 respectively have input pins $33_{in}$, $34_{in1}$, $34_{in2}$, $35_{in1}$, $35_{in2}$, and $36_{in}$.

The output pins of the cells 32–36 each preferably connect to a single input pin, namely an input pin of another of the cells 31–33 and 35. The output pin of the cell 31 does not connect to any input pin of any of the cells within the tree 28. Because of this, the cell 31 is referred to as the root of the logic tree 28. The output pin of the root cell 31 can be connected with any number of input pin cells, such as the input pins of cells such as cells 40, located outside of the rectangle 38. The input pins $32_{in1}$, $32_{in2}$, $34_{in1}$, $34_{in2}$, $35_{in1}$, and $36_{in}$ are connected with cells located outside of the tree 28 and are referred to as entrances to the tree. The input values of the entrances connected with a wire are preferably identical to one another. That is, pins $32_{in1}$, and $34_{in1}$ are connected by wire 42 and have the same input value, and the pins $34_{in2}$ and $35_{in1}$ are connected by wire 44 and have the same input value.

In the design of integrated circuits, it is desired to optimize placement of the cells in accordance with various design considerations. This may be done by determining an optimal arrangement of the cells in a plane and configuring an efficient routing scheme that achieves a desired functionality. The location of each cell on the substrate 10 is defined by its coordinates. The coordinates of a cell and the substrate boundaries are preferably referred to in terms of rectangular coordinates, such as $(x_i, y_i)$, where i=1, 2, ... n. However, it will be understood that coordinates can be defined in other ways, such as in terms of polar coordinates.

In attempting to optimize the placement of the cells, an initial layout or set of cell coordinates may be provided using known techniques. This may be done for the entire integrated circuit, including all of its components, as by processing under a placement algorithm, such as described in commonly assigned U.S. Pat. No. 5,858,782, entitled Efficient Multiprocessing for Cell Placement of Integrated Circuits, the entire disclosure of which is incorporated herein by reference. Alternatively, as also described in U.S. Pat. No. 5,858,782, a subset or sub-area 46, such as depicted in FIG. 1 may be processed.

Figure 4:
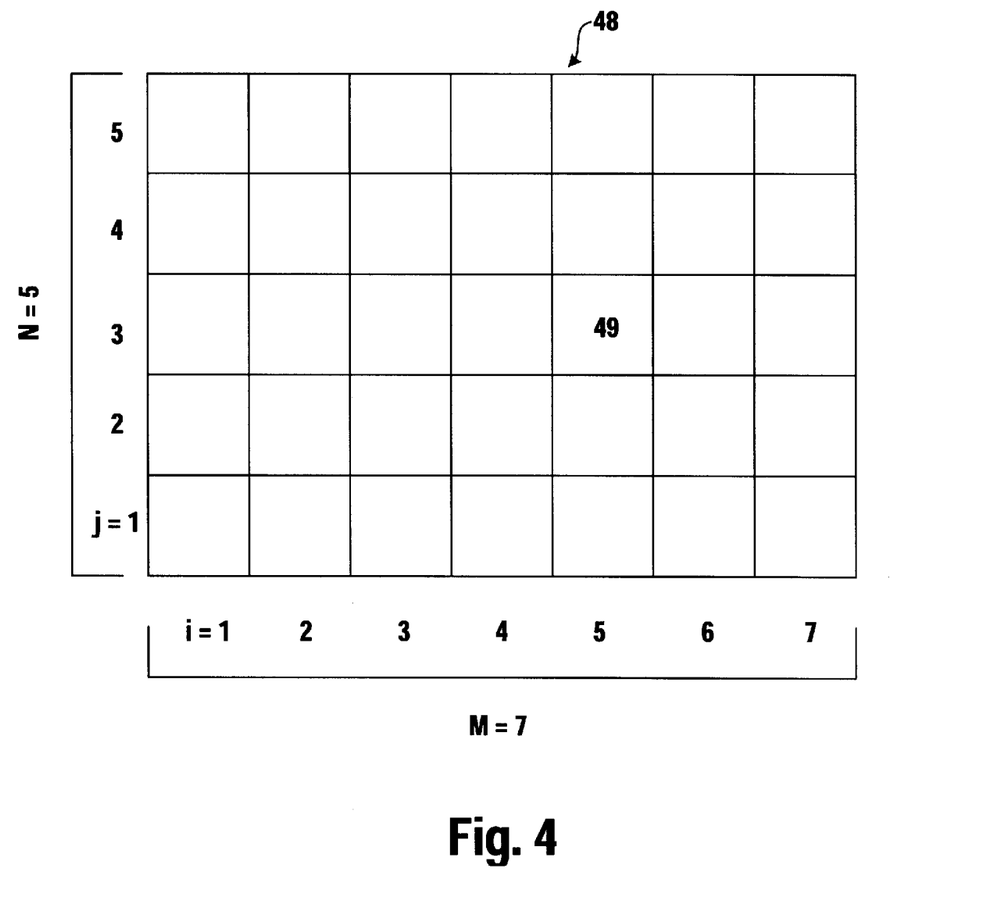
FIG. 4 is a representational view of a substrate, showing division of the surface of the substrate into a grid.

Assignment of initial cell coordinates after placement of cells 24 on a substrate surface is preferably provided by a grid or lattice 48 as shown in FIG. 4. The lattice has five rows designated rows j=1, 2, 3, 4 and seven columns designated i=1, 2, 3, 4, 5, 6, 7. Accordingly $cell_{35}$ is in row j=3 and column i=5 indicated by reference numeral 49. The initial cell coordinates assigned to the cells by lattice 48 are preferably also called the old cell coordinates.

The area of the substrate 12 to be processed is preferably further divided into regions defined by distinct logic trees, and the coordinates of the logic trees determined. In the context of this invention, such initial logic trees are referred to herein as old or input logic trees. The coordinates of all cells connected with the output pin of the root cell of the tree, for example cell 31 as depicted in FIG. 2, and the coordinates of the tree entrances, or in other words the input pins $32_{in1}$, $32_{in2}$, $34_{in1}$, $34_{in2}$, $35_{in1}$, and $36_{in}$, also depicted in FIG. 2, define the logic tree coordinates.

Each old logic tree is preferably reconstructed into a new logic tree, preferably using iterative optimization processes known as resynthesis. Resynthesis may be carried out using multiple computers to perform iterative applications of desired optimization algorithms. A particularly preferred method for optimizing a logic tree is described in commonly assigned U.S patent application Ser. No. 09/678,478, filed Oct. 2, 2000, and entitled Method and Apparatus for Dynamic Buffer and Inverter Tree Optimization, the entire disclosure of which is incorporated herein by reference.

The purpose of the present invention is to optimize the placement of individual cells of the new logic trees in a manner which takes into account the relative positions or density of the cells within the logic tree. One benefit of optimization in accordance with the invention is the avoidance of undesirable crowding of cells within a logic tree. In one aspect, this is achieved by maintaining desirable cell density characteristics within a logic tree. That is, the cells are arranged according to the invention in such a manner that overcrowding of cells is avoided. Cell overcrowding is undesirable and can cause overflow problems such as conflicts between traces. Once an optimized density-based placement of the cells is achieved, coordinates are preferably assigned to each cell corresponding to its optimized location.

The method of the invention preferably uses as input information (1) the coordinates of an old logic tree, and (2) the coordinates of all cells of a new logic tree that are connected to the output pin of the tree root and the coordinates of the tree entrances.

Figure 5:
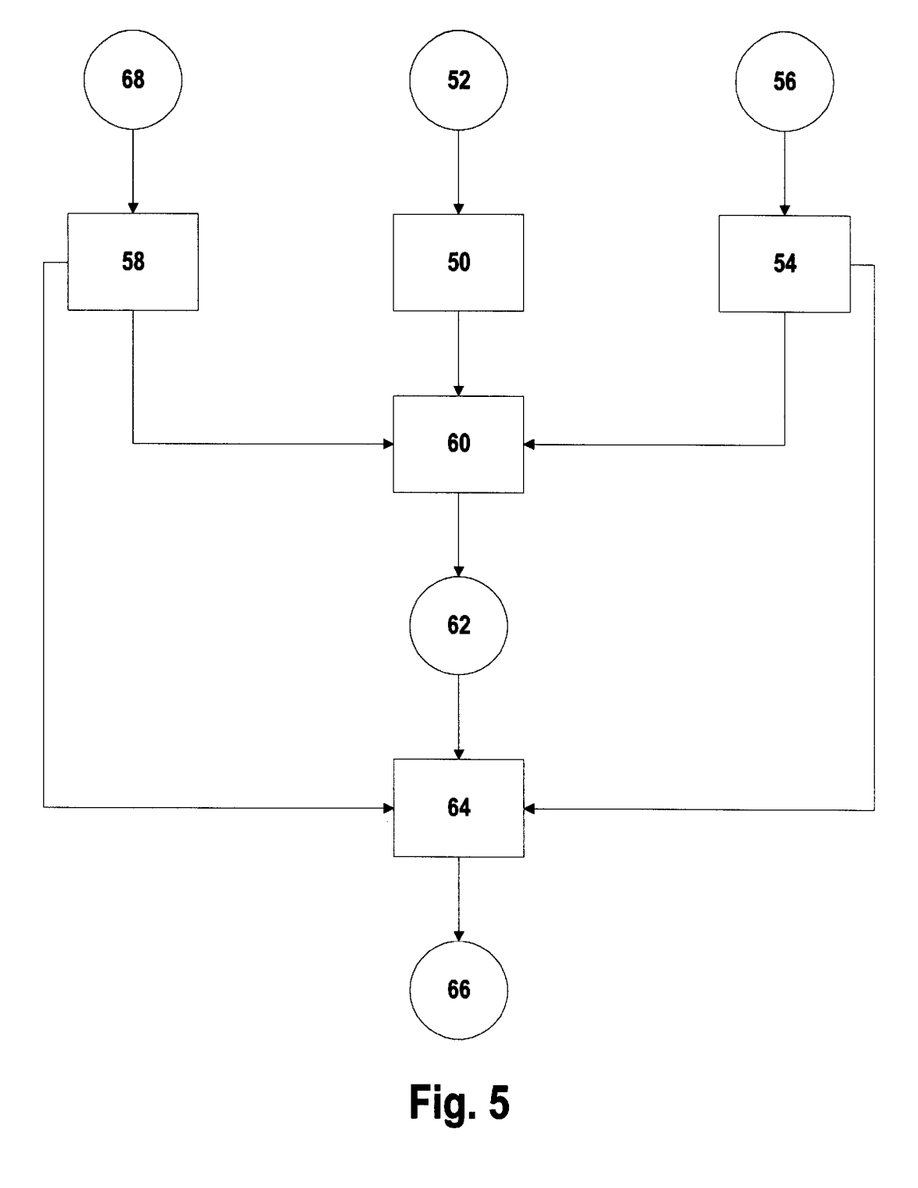
FIG. 5 is a flow diagram showing preferred steps of a method for assigning density-based coordinates to new logic tree cells in accordance with the invention.

With reference to the flow diagram of FIG. 5, and in accordance with the invention, an overview of the method is presented, followed by a detailed description of the method. In step 50, input information 52 corresponding to the known coordinates of the old logic tree is used to obtain the positions or coordinates of the cells of the old logic tree. In step 54, input information 56 corresponding to the known coordinates of the cells of the new logic tree is used to obtain approximate coordinates of the cells of the new logic tree. As described above, the new logic tree is preferably obtained by an iterative resynthesis of the old logic tree. In step 58, input information about the importance of the cells of the new logic tree (Block 68) is used to sort the cells based on the importance of each cell.

In step 60, information corresponding to the coordinates of the cells of the old logic tree, the sorted cells of the new logic tree, and the approximate coordinates of the new logic tree is used to assign coordinates to each cell of the new logic tree, taking into account cell density. This yields information 62 corresponding to optimized and cell density-based coordinates for each cell of the new logic tree. If desired, for medium and high effort levels, additional optimization may be applied in step 64 to yield further optimized coordinate information 66.

Step 50—Obtaining Coordinates of Cells of Old Logic Tree

In step 50, the positions or coordinates of the cells of the old logic tree are preferably determined. The information 52 corresponding to the coordinates of an old logic tree, or in other words the outline of the tree, is preferably initially known. These coordinates are preferably expressed as a triple (x, y, w) for all cells of the old logic tree item by item.

The cells of the tree have coordinates (x, y), with $w=w_1+w_2$, where $w_1$ is the width of the cell. The width of the cell is equal to $(Cell_{xmax}-Cell_{xmin})/D_{vert}$. $Cell_{xmax}$ and $Cell_{xmin}$ are the x coordinates of the outline of the cell and $D_{vert}$ is the distance between neighbor vertical grids. $w_2$ is the free space of the position (x, y) and w is the free space of the position (x, y) if the width of the considered cell is removed. The tern free space refers to available space for placement of a cell at a position on the grid.

The free space is preferably computed as follows, with the matrix FreeGrids representing the density map of the area:

FreeSpace=$a_{-2}$·FreeGrids [i−2][j]+$a_{-1}$·FreeGrids [i−1][j]+FreeGrids[i][j]+$a_1$·FreeGrids [i+1][j]+$a_2$·FreeGrids [i+2][j], where $a_k$ are coefficients (k=−2, −1, 1, 2) such that $0 \leq a_k \leq 1$ and $a_k=0$ if i+k<0, or i+k $\geq$ ColumnNumber, or FunctionRegion[n][i+k}[j]=0, or RepeaterFlag=0 and [i+k][j]=0, or RepeaterFlag=0 and GrayBox[i+k][j]=1. Typically, in all other cases, $a_{-2}=a_{-1}=a_1=a_2=1$. It will be understood that other values of these coeffceints may also be used.

In the event FreeSpace<FreeGridsInGroup [i/GroupCardinality][j] then FreeSpace=FreeGridsInGroup [i/GroupCardinality][j]. As will be appreciated, this aspect gives consideration to the cell density of the group in the column parts.

In the event FreeSpace<FreeGridsInRow[j] then FreeSpace=FreeGridsInRow[j]. As will be appreciated, this aspect gives consideration to the cell density of the rows, with the array FreeGridsInRow describing the free space of the rows.

If DualFlag=1, then FreeSpace is calculated for the i-th column and the j'-th row in the same way, where j'=j+1 if DualChar[j]=1, and j'=j−1 if DualChar[j]=2. Then, FreeSpace is assumed to be equal to min(FreeSpace, FreeSpace'), with FreeSpace being the result of the procedure.

Input parameters x and y are the coordinates of the position, n is the cell function number, Repeater Flag is a flag which is equal to 1 only if the cell is a repeater, and Dual Flag is a flag which is equal to 1 only if the cell is a dual height cell. The procedure returns to 0 if there is no free space in the position, otherwise it returns the quantity of the free space.

In addition, it is assumed in the procedure that point (x, y) belongs to the i-th column and the j-th row. However, if the point (x, y) does not belong to the n-th function region (FunctionRegion[Function][i][j]=0), or RepeaterFlag=0 and GrayBox[i][j]=1, or DualFlag=1 and DualChar[j]=0, then the cell cannot be placed in the given position and the procedure returns to 0.

The output of the FreeSpace calculation is the set S={$(x_1, y_1, w_1), \ldots, (x_m, y_m, w_m)$}, where $(x_i, y_i)$ (i=1, 2, . . . , m) are the coordinates of the i-th cell of the old logic tree and $w_i$ is the free space of the position $(x_i, y_i)$ (i=1, 2, . . . , m). This information is used in step 60, explained in more detail below.

Step 54—Computing Approximate Coordinates of New Logic Tree Cells

In step 54, input information 56 corresponds to the known coordinates of the cells of the new logic tree, which are preferably connected to the output pin of the tree root and the coordinates of the tree entrances. The information 56 is used to obtain approximate coordinates for all cells of the new logic tree. The set of coordinates of the pins of each cell is defined as $\{(x_i, y_i)*i=1, 2, \ldots, n\}$.

In a preferred embodiment, the approximate new coordinates are calculated by a mass center method or median method or the like. For the mass center method, the coordinates of the cell are defined by the following:

$$\left(\frac{1}{n}\sum_{i=1}^{n} x_i, \frac{1}{n}\sum_{j=1}^{n} y_j\right)$$

For the median method, the set or coordinates are sorted so that sets $\{(x_i|i=1, 2, \ldots, n\}$ and $\{y_j|j=1, 2, \ldots n\}$ are provided. The coordinates of the cells are assigned as $(x_{n/2}, y_{n/2})$. The mass center method is typically used for a low or medium effort level and the median method is typically used for a high effort level. The effort level preferably corresponds to the number of computational iterations before the desired result is achieved. Generally speaking, the item-by-item examination cycle is repeated until the coordinates of the cells become stable, which preferably occurs in from about ten to about twenty iterations.

The resulting stable coordinates are the approximate coordinates of all cells of the new logic tree. In step 58, these cells are sorted in accordance with their importance.

Step 58—Sorting Cells in Decreasing Order of Importance

In this step, the approximate coordinates of all cells of the new logic tree from step 54 are examined on an item-by-item basis, a ramp time violation for the output pin of the cell is determined, and the cell is placed on an output list. The ramptime violation of the cell C is CellRamptime Violation (C)=max{CellPinCap(i)−CellPinMaxCap(i)|i=1, . . . , k}, where k is the number of the output pins of the cell C, CellPinMaxCap(i) is the maximal allowed capacity of the net driven by the i-th output pin of the cell C, CellPinCap(i) is the capacity of the net driven by the i-th output pin of the cell C. A slack of a pin P is Slack(P)=RequiredTime-MaxPathDelay(P), where MaxPathDelay(P) is the maximal delay of the path going through the pin P. A slack of the cell is the minimal slack of the cell pins.

The output list of cells is sorted in decreasing order with respect to the cell ramp time violations. During the timing optimization each entrance of the logic tree has a slack. The importance of each cell is preferably initially set to be equal to zero and the entrances of the new logic tree are examined on an item-by-item by basis. If the slack of the considered entrance is Slack<0, the set $\{a_1, a_2, \ldots a_n\}$ is determined for all parent cells of the considered entrance, where $a_1$ is the father of the considered entrance, $a_2$ is the father of $a_1$, and so on, and $a_n$ is the root of the new logic tree.

The importance of each ai is increased by an amount corresponding to the value of (−Slack)/n (i=1, 2, . . . n). After all entrances have been examined, all new logic tree cells are placed on the output list and sorted in decreasing order of importance. Next, during the area optimization, the importance of each cell is preferably set as equal to 1. This tends to eliminate the need to sort the output list of the new logic tree cell.

The result of this step is a list or set C of cells of the new logic tree sorted in the decreasing order of their importance and the set P={$p_1, p_2, \ldots p_n$}, where $p_i$ is the importance of the i-th cell (i=1, 2, . . . n).

In this regard, it is noted in general that the resynthesis process preferably consists of three optimization stages, namely ramptime optimization, timing optimization, and area optimization. Therefore the importance of the cell depends on the stage of the resynthesis. In the ramptime optimization stage, the cell importance is equal to the ramptime violation of the output pin of the cell. In timing optimization stage, the cell importance is determined by the slacks of the tree entrances. In area optimization stage, the cell importance is equal to 1.

Step 60—Assing Coordinates to the Cells of the New Logic Tree

As noted above, the output of step 50 is the set $S=\{(x_1, y_1, w_1) \ldots, (x_m, y_m, w_m)\}$, where $(x_i, y_i)$ are the coordinates of the i-th cell of the old logic tree and $w_i$ is the free space of the position $(x_i, y_i)$ (i=1, 2, ..., m).

The output of step 58 is a list or set C of cells of the new logic tree sorted in the decreasing order of their importance and the set $P=\{p_1, p_2, \ldots p_n\}$, where $p_i$ is the importance of the i-th cell (i=1, 2, ... n).

In step 60, the outputs of steps 50, 54, and 58 are used to assign new coordinates to the cells of the new logic tree based on cell-density. For the sake of a visual example, and with reference to FIG. 6, in accordance with this step a new cell is assigned on an item-by-item basis to a grid 69 so that an origin point 70 of the cell has the coordinates determined in step 54.

Figure 6:
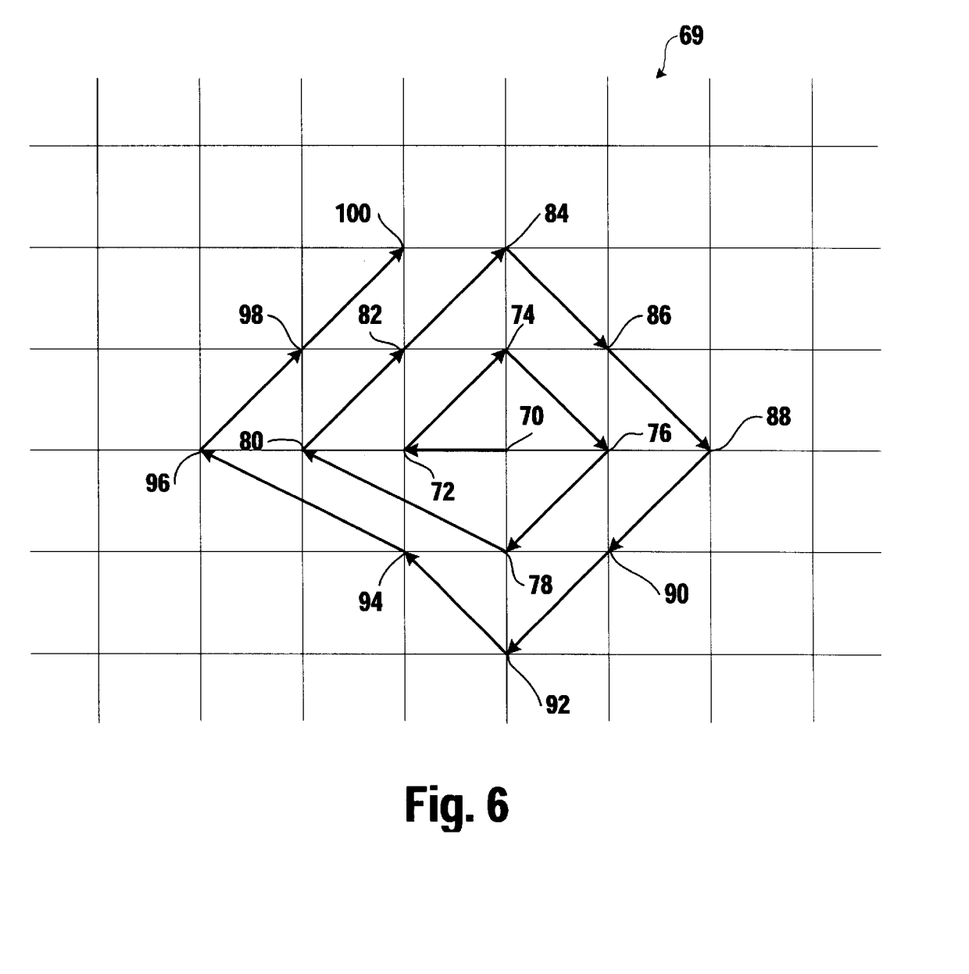
FIG. 6 is a representational view showing aspects of the assignment of cell coordinates based on cell density.

In general terms, it will be understood that he input of the procedure is the cell c, w is the width of the cell c, and (x,y) are the approximate coordinates obtained in the step 54. The point (x,y) belongs to the i-th column and the j-th row of the lattice (point 70 in FIG. 6). The lattice points are examined beginning at the point 70 and moving in an outwardly spiraling pattern as shown in FIG. 6 to points 72 through 100. For each point 70 and 72–100 denoted by LatticePoint, the free space w(LatticePoint) of the point LatticePoint is calculated as described above. That is a cell having width is no more than w(LatticePoint) may be placed in the lattice point LatticePoint. If w≦w(LatticePoint) then the coordinates of the point LatticePoint and w(LatticePoint) are the result of the procedure.

In other words, the input of the step 60 are set $C=\{c_1, c_2, \ldots c_n\}$ of cells of the new logic tree sorted in the decreasing order of their importance obtained in step 58, the approximate coordinates of the cells of the new logic tree obtained in Step 54, and, from step 50, the set of triples $S=\{(x_1, y_1, w_1), \ldots, (x_m, y_m, w_m)\}$, where $(x_i, y_i)$ are the coordinates of the i-th cell of the old logic tree and $w_i$ is the free space of the position $(x_i, y_i)$ (i=1, 2, ..., m).

The value of I is initially set to be equal to 1. $W_i$ is the width of the cell $c_i$, $(X_i, Y_i)$ be the approximate coordinates of the cell $c_i$ obtained in the step 54. Step 60 described above (assigning coordinates) is applied to the cell $c_i$, with $(x_{m+1}, y_{m+1}, w_{m+1})$ being the result of this procedure. This triple is added to the set S. For each j=1, 2, ..., m+1, the value $D_j$, is calculated, where $D_j=0$ if $w_j<W_i$ and $D_j=|x_j-X_i|+|y_j-Y_i|$, otherwise q is the number such that $D_q=\min\{D_j: j=1, 2, \ldots m+1\}$. The pair $(x_q, y_q)$ is the new assigned coordinates of the cell $c_i$. Next, the triple $(x_{m+1}, y_{m+1}, w_{m+1})$ is removed from the set S. Then, if q≦m the triple $(x_q, y_q, w_q)$ is removed from the set S, and m is set to equal m−1, and the triples of the set S are enumerated from 1 to m. If i=n the procedure is exited, otherwise the value of (i) is set equal to i+1 and the process repeated.

Step 62—Improving the Coordinates of the New Logic Tree Cells

In optional step 62, the initial input is a set of pentads $R=\{(x_1, y_1, u_1, v_1, p), \ldots, (x_n, y_n u_n, v_1, p_n)\}$, where $(x_i, y_i)$ are the approximate coordinates of the i-th cell of the new logic tree obtained previously in step 54. ($u_i, v_i$ are the exact coordinates obtained in step 60. $p_i$ is the importance of the i-th cell (I=1, 2, ... n) sorted in decreasing order of importance and obtained in step 58, step 62 is desirably performed for medium and high effort levels.

In step 62, all pentads of the set R are examined on an item by item basis. For each pentad $(x_i, y_i, u_i, v_i, p_i)$ (i=1, 2, ... n), the following steps are performed:
1) compute the value of $d_i=(x_i-u_i+y_i-v_i)\cdot p_i$
2) assign $D_{min}=0$
3) consider all pentads of the set $\{(x_1, y_1, u_1, v_1, p_1), \ldots, (x_n, y_n, u_n, v_n, p_n)\}$ item by item. For each pentad $(x_j, y_j, u_j, v_j, p_j)$ (j=i+1, ... n), compute the value $D_i$, where $$D_i = d_i + (x_j - u_j + y_j - v_j) \cdot p_j - (x_i - u_j + y_i - v_j) \cdot p_j$$

If $D_{min}<0$, assign $D_{min}=D_j$ and $J_{min}=j$

4) If $D_{min}<0$, set the i-th pentad to be equal to $(x_{jmin}, y_{Jmin}, u_i, v_i, p_i)$ and the $J_{min}$-th pentad to be equal to $(x_i, y_i, u_{Jmin}, v_{Jmin}, P_{Jmin}$, which means that pair $(x_{Jmin}, y_{Jmin})$ become the coordinates of the i-th cell.

The result is the information 66 corresponding to improved coordinates $(x_{Jmin}, y_{Jmin})$.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for selectively assigning coordinates to cells of a logic tree incorporated into an application-specific integrated circuit formed on a substrate surface, the method comprising the steps of:
   (a) determining coordinates of an old logic tree and performing an optimization of the old logic tree to obtain a new logic tree;
   (b) determining coordinates for cells of the new logic tree which are connected to an output pin of the new logic tree
   (c) determining coordinates for tree entrances to the new logic tree;
   (d) determining coordinates for all cells of the old logic tree from the coordinates of the old logic tree determined in step (a),
   (e) determining approximate coordinates for the cells of the new logic tree from the coordinates of the cells of a new logic tree connected to the output pin of the new logic tree determined in step (b) and the coordinates of the tree entrances to the new logic tree determined in step (c);
   (f) sorting the approximate coordinates determined in step (e) based on the importance of each cell;
   (g) determining optimized coordinates for each cell of the new logic tree based on the approximate coordinates of the new logic tree determined in step (e), the sorted approximate coordinates determined in step (f), and the coordinates of the cells of the old logic tree determined in step (d).

2. The method of claim 1, wherein the step (d) yields a set $S=\{(x_1, y_1, w_1), \ldots, (x_m, y_m, w_m)\}$, where $(x_i, y_i)$ are the coordinates of the i-th cell of the old logic tree and $w_i$ is the free space of the position $(x_i, y_i)$ (i=1, 2, ..., m).

3. The method of claim 1, wherein step (e) determining approximate coordinates for the cells of the new logic tree, comprises calculating coordinates based on a mass center method or median method, wherein for the mass center method, the coordinates of the cell are defined by the following:

$$\left(\frac{1}{n}\sum_{i=1}^{n} x_i, \frac{1}{n}\sum_{j=1}^{n} y_j\right)$$

and for the median method, the set or coordinates are sorted so that sets $\{(x_i|i=1, 2, \ldots, n\}$ and $\{y_j|j=1, 2, \ldots n\}$ are provided and the coordinates of the cells are assigned as $(x_{n/2}, y_{n/2})$.

4. The method of claim 1, wherein the step (f) of sorting yields a list of cells of the new logic tree sorted in the decreasing order of their importance and a set $P=\{p_1, p_2, \ldots p_n\}$, where $p_i$ is the importance of the i-th cell (i=1, 2, ... n).

5. The method of claim 1, wherein in the step (g) of determining optimized coordinates, the set $C=\{c_1, c_2, \ldots c_n\}$ represents the coordinates of the new logic tree sorted in the decreasing order of their importance obtained in step (f), and, the set of triples $S=\{(x_1, y_1, w_1), \ldots, (x_m, y_m, w_m)\}$ represents the coordinates of the old logic tree determined in step (d), where $(x_i, y_i)$ are the coordinates of the i-th cell of the old logic tree and $w_i$ is the free space of the position $(x_i, y_i)$ (i=1, 2, ..., m).

6. The method of claim 1, further comprising the step of additionally optimizing the coordinates of step (g).

* * * * *